United States Patent [19]

Cowles et al.

[11] 4,318,092

[45] Mar. 2, 1982

[54] MEANS FOR CHECKING BATTERY VOLTAGE LEVEL

[75] Inventors: Arthur L. Cowles, River Falls; Thomas C. Ensign, Hudson Township, St. Croix County, both of Wis.

[73] Assignee: Minnesota Mining and Manufacturing Company, Saint Paul, Minn.

[21] Appl. No.: 115,340

[22] Filed: Jan. 25, 1980

Related U.S. Application Data

[63] Continuation of Ser. No. 913,598, Jun. 8, 1978, abandoned.

[51] Int. Cl.³ .............................................. G08B 21/00
[52] U.S. Cl. .................................... 340/636; 324/133; 324/433; 340/661; 340/664
[58] Field of Search ............... 340/636, 661, 660, 664; 324/133, 72.5, 96, 433; 73/190 R

[56] References Cited

U.S. PATENT DOCUMENTS

| | | | |
|---|---|---|---|
| 3,204,193 | 8/1965 | Rhyne, Jr. | 307/362 X |
| 3,535,593 | 10/1970 | Schweitzer, Jr. | 340/664 X |
| 3,600,678 | 9/1969 | Garrett et al. | 324/72.5 X |
| 3,787,885 | 1/1974 | Johnson | 324/29.5 X |
| 3,806,803 | 4/1974 | Hall | 324/72.5 X |
| 3,851,528 | 12/1974 | Nichols et al. | 328/48 |
| 3,921,064 | 11/1975 | Mori et al. | 324/29.5 |
| 3,925,771 | 12/1975 | Satake | 324/29.5 X |
| 3,942,009 | 3/1976 | Taylor | 250/338 |
| 3,997,831 | 12/1976 | Hopfner | 320/48 |
| 4,020,243 | 4/1977 | Oldford | 340/636 X |

OTHER PUBLICATIONS

Publ. "RCA Integrated Circuits", RCA Data Book, pp. 195-199, (CA3078, CA3078A Amplifiers) C, 1926.

Primary Examiner—John W. Caldwell, Sr.
Assistant Examiner—Daniel Myer
Attorney, Agent, or Firm—Cruzan Alexander; Donald M. Sell; Robert L. Marben

[57] ABSTRACT

Means for checking the voltage level of a battery used in an apparatus including an operational amplifier powered from the battery and an indicating means operatively connected to the output of the operational amplifier. The indicating means provides a replace battery indication which is presented when the battery is in a replacement condition and the amplifier is operated at saturation.

6 Claims, 6 Drawing Figures

MEANS FOR CHECKING BATTERY VOLTAGE LEVEL

This is a continuation of application Ser. No. 913,598, filed June 8, 1978, now abandoned.

BACKGROUND OF THE INVENTION

This invention relates to means for checking the battery or batteries in a battery operated device for low voltage.

Many battery powered devices are presently being marketed which have a critical function, making it desirable that a convenient and uncomplicated way be provided to check the viability of the battery power to avoid the need for replacement of batteries for such devices on a regular time basis. for example, it is important that the user of battery powered smoke detectors know if the battery for such a device needs replacing. The 3M Brand heat scanner (model 201 series) is also a battery operated device which is hand held and can be used in critical situations, making it desirable that the user know if its battery sources need replacing.

A number of micropower linear integrated circuits have evolved which can provide the function of sensing for low battery voltage. This approach requires the addition of circuitry to the battery operated device adding to its weight, cost, power consumption and the possible need for one or more separate reference battery power sources and additional space.

SUMMARY OF THE INVENTION

This invention provides an alternate means that is less sophisticated, yet reliable and inexpensive, for obtaining an indication of a low battery voltage condition without the need for a reference voltage source and, in some applications, does not require any additional circuitry.

The apparatus of this invention includes an operational amplifier powered from the battery source of the battery operated device and indicating means operatively connected to the output of the operational amplifier. The indicating means provides a replace battery indication that is presented when the battery is in a replacement condition and the operational amplifier is operated at saturation.

In some cases the operational amplifier and/or the indicating means may be a part of the functioning circuitry for a battery operated device which, by use of this invention, can provide the means for checking the batteries for low voltage.

DESCRIPTION

Figure 1:
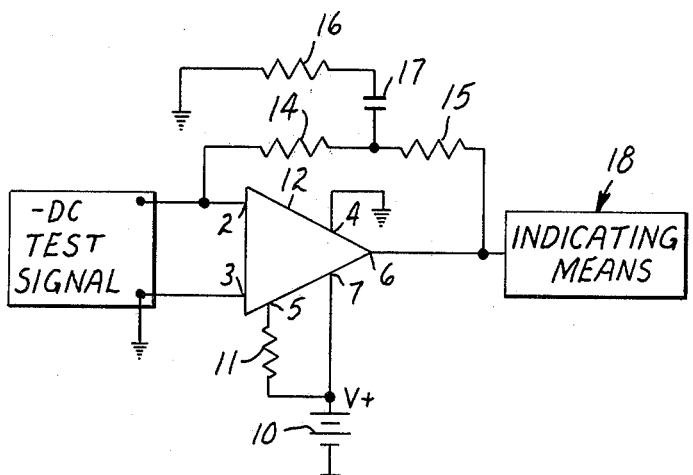
FIG. 1 is a schematic of one embodiment of the invention.

The invention in its most basic form is embodied in the circuitry shown in FIG. 1. The battery 10 represents a battery that is used in a device (not shown). A function of the circuitry of FIG. 1 is to provide an indication when the battery 10 needs to be replaced.

The circuitry of FIG. 1 includes an operational amplifier 12 which is powered from the battery 10. The positive terminal V+ of the battery is connected directly to the terminal 7 of the amplifier and to terminal 5 of the amplifier via a resistor 11. Since only a unipolar battery supply is being used, the terminal 4 of the amplifier is connected to ground. The resistors 14–16 and the capacitor 17 establish the gain for the amplifier. The inputs 2, 3 are used to present a D.C. test signal to the amplifier when a check of the condition of battery 10 is desired. The presence of a negative signal at input 2 will cause the output 6 of the amplifier to be positive. It is essential that the negative D.C. test signal used be of a level sufficient to cause the amplifier to operate at saturation.

An indicating means 18 is connected to the output 6 of the amplifier. It is the function of the indicating means to provide a perceptible indication when a negative saturating D.C. test signal is applied to the amplifier and the voltage level provided by battery 10 is less than a predetermined level, such predetermined level being the lowest acceptable voltage for battery 10. Accordingly, if the perceptible indication is presented with the negative saturating signal applied to the amplifier, the battery 10 should be replaced.

Figure 2:
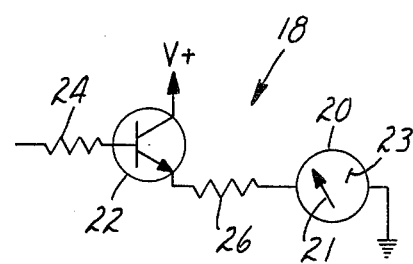
FIG. 2 is a schematic of an indicating means suitable for use in the embodiment of FIG. 1.

The indicating means 18 can take on a number of forms. One suitable form is shown in FIG. 2. An ammeter 20 of the type having a meter face and meter movement is used which, if the amplifier 12 cannot provide a usable driving current for the meter 20, requires a drive circuit such as that provided by the NPN transistor 22. The base of transistor 22 is connected via a resistor 24 to the output 6 of the amplifier 12, its collector is connected to the V+ voltage provided by battery 10 and its emitter is connected via resistor 26 to the ammeter 20. With no signal presented to the amplifier 12, the meter movement, as indicated by the needle 21, is at zero. It should be noted that unlike the operational amplifier 12, the transistor drive circuit described provides an output that is independent of the battery voltage.

An indicating mark 23 is provided on the meter face of meter 20 which serves as a replace battery reference position. The mark corresponds to the position the meter movement assumes when the operational amplifier is set to provide a predetermined gain and terminal 7 is receiving a voltage at the lowest acceptable level for battery 10 and the operational amplifier is receiving a negative saturating D.C. test voltage. With this arrangement, the condition of battery 10 can be readily checked by applying a saturating test signal to the amplifier 12 and observing the degree to which the needle 21 deflects relative to the mark 23. If the needle 21 does not reach the mark 23, the battery 10 should be replaced.

While the circuit of FIG. 1 has been described using a positive battery voltage connected to terminal 7 of the amplifier 12, the circuit is also operable when terminal 7 is connected to ground and battery 10 is connected with its negative terminal connected to terminal 4. In this case, a positive saturating test signal must be applied to terminal 2 to test battery 10. In addition, the indicating means requires inversion of the output from the amplifier 12 or the use of a PNP transistor instead of the NPN transistor 22.

Situations can arise where a device may be using two batteries connected in a bipolar configuration and must be checked from time to time to determine whether they should be replaced. In such case, the circuit of FIG. 3 can be used which is similar to that of FIG. 1, except that terminal 4, instead of being connected to ground, is connected to the negative terminal V— of the second battery shown at 28 and a different indicating means 30 is used.

Since two batteries are to be checked, the indicating means 30 functions to provide a perceptible indication when a negative saturating D.C. test signal is applied to the amplifier 12 and the voltage level provided to terminal 7 of the amplifier is at the lowest acceptable level and functions to provide a perceptible indication when a positive saturating D.C. test signal is applied to the amplifier and the voltage level provided to terminal 4 of the amplifier is at the lowest acceptable level.

Figure 3:
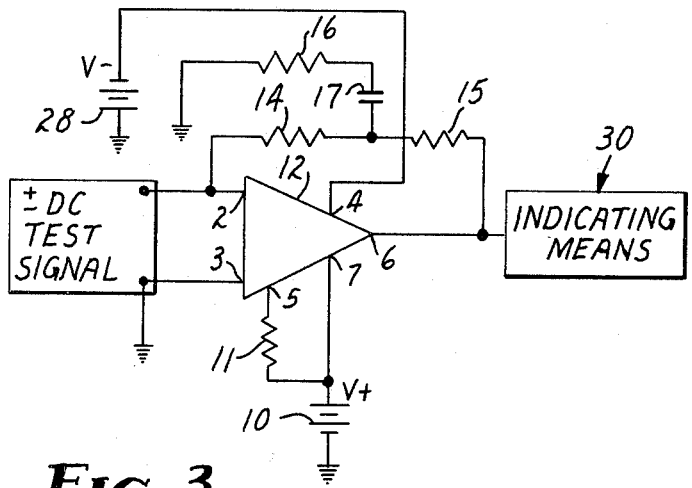
FIG. 3 is a schematic of another embodiment of the invention.
Figure 4:
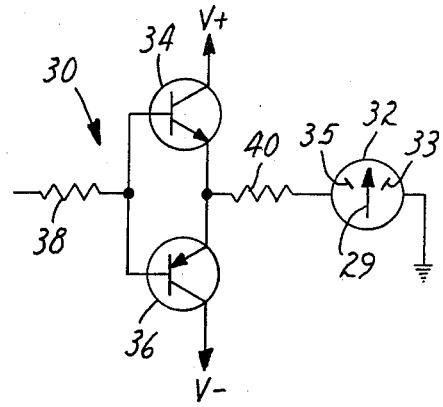
FIG. 4 is a schematic of an indicating means suitable for use in the embodiment of FIG. 3.

A usable indicating means 30 is shown in FIG. 4. An ammeter 32 is used which is a center zero reading meter. Assuming a drive circuit is needed for the meter, an NPN transistor 34 is provided to supply current to the meter when the amplifier output 6 is positive and a PNP transistor 36 is provided to supply current to the meter when the amplifier output is negative. The bases of the transistors are connected to the output 6 of amplifier 12 of FIG. 3 via a resistor 38, while the emitter electrodes are connected to the meter 32 via a resistor 40. The collector of transistor 34 is connected to the positive voltage V+ provided by battery 10, while the collector of transistor 36 is connected to the negative voltage V— provided by battery 28.

With no signal applied to the input terminals 2, 3 of the operational amplifier 12 of FIG. 3, the meter movement for meter 32, as indicated by the needle 29, is at the center or zero position and deflects to the right or left of center dependent on the polarity of the output 6 of operational amplifier 12 in FIG. 3.

Indicating marks 33 and 35 are provided on the meter face of the ammeter 32 which serve as replace battery reference positions. One of the marks corresponds to the position the meter movement assumes when the terminals 4 of amplifier 12 of FIG. 3 is presented with a voltage corresponding to the lowest acceptable level for battery 28 and the operational amplifier 12 is receiving a positive saturating test signal at input 2 to cause the needle 29 of the meter to be positioned opposite such mark. The other mark corresponds to the position the needle 29 of the meter assumes when terminal 7 of amplifier 12 of FIG. 3 receives a voltage at the lowest acceptable level for a battery 10 and the operational amplifier 14 is receiving a negative saturating test signal at terminal 2.

With such an arrangement the movement of needle 29 relative to the marks 33 and 35 can be observed when a positive saturating test signal is applied and when a negative saturating test signal is applied. Failure of the needle 29 to reach mark 33 indicates the battery that controls such deflection should be replaced, while failure of the needle 29 to reach mark 35 indicates the battery that controls such deflection should be replaced.

The circuit of FIG. 3 and its use with the indicating means 30 shown in FIG. 4 has been described wherein the only signals applied to the operational amplifier 12 are test signals. Such circuitry without the indicating marks 33 and 35 positioned as described and with a pyroelectric sensing element connected to terminals 2 and 3 of the amplifier 12 is prior art. The circuitry of FIG. 1 used with the circuitry of FIG. 2, but without the indicating mark 23 located, as described, is also considered to be prior art. The pyroelectric sensing element responds to the rate of change in sensed temperature to provide a D.C. signal of one polarity when the rate of change is negative and provides a D.C. signal of the opposite polarity when the rate of change of temperature sensed is positive.

The prior art portion of the circuitry of FIGS. 3 and 4 in such form is utilized in a heat scanner (model 201 series) sold by the Minnesota Mining and Manufacturing Company, St. Paul, Minnesota, which also utilizes the teachings of U.S. Pat. Nos. 3,942,009 to Allen L. Taylor and 4,044,251 to Allen L. Taylor et al. Such prior art heat scanner had no provision for determining the condition of the batteries. Instructions that are provided with the prior art heat scanner direct the user to change the batteries at regular intervals of time to assure proper operation of the scanner.

By providing the marks 33 and 35, as described in accordance with the present invention, to the meter used in the above-described heat scanner, the condition of one battery of the circuit of FIG. 3 can be readily checked by a user. The user can direct the sensor of the heat scanner toward an area which presents a substantial rate of change of temperature to the sensor to cause a saturating signal to be applied to the amplifier 12 of FIG. 3 to cause the needle 29 to deflect in one direction. The deflection can be observed relative to the mark associated with such deflection to determine whether one battery should be replaced. By then directing the sensor of the heat scanner away from such area, a saturating signal of the opposite polarity is presented to the amplifier to cause the needle 29 to deflect in the opposite direction, which deflection can be observed relative to the other mark to determine whether the other battery should be replaced. Directing the scanner at the user's hand and then away from the hand will normally provide the desired rate of change temperature for checking the two batteries.

Such an arrangement provides an excellent and reliable indication of the condition of the batteries, since the operational amplifier is operated at saturation when the battery condition is being checked and when so operated provides an output which decreases linearly with decreasing battery voltage through the range of battery voltages where a battery should be replaced. In addition, it should be appreciated that the batteries are being checked under load which makes the test more reliable.

Figure 5:
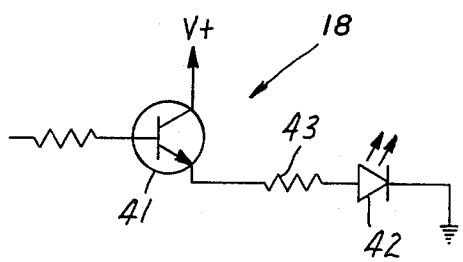
FIG. 5 is a schematic of an indicating means usable in the embodiment of FIG. 1.

It is not necessary that a meter be used to provide an indication means 18 or 30. For example, FIG. 5 shows a circuit that can be used with the operational amplifier 12 of FIG. 1 to provide the low battery indication required for the indicating means 18 of FIG. 1 when a saturating test signal is applied to the amplifier 12 wherein a light source provides the replace battery indication. As in FIG. 2, the circuit of FIG. 5 includes an NPN transistor 41 as a drive circuit for a light source, for example, a light emitting diode (LED) 42. The anode of LED 42 is connected to the emitter of transistor 42 via a resistor 43 with the cathode of the LED connected to ground for the circuit of FIG. 1. It is necessary, however, that the normal voltage provided by battery 10 be sufficient to operate an LED. if the circuit of FIG. 1 were changed so the negative terminal of battery 10 was applied to the terminal 4 with terminal 7 connected to ground, a PNP transistor would be used as the drive circuit and the LED 42 would be connected in a reverse fashion with its anode connected to the circuit ground. With the proper selection made for resistor 43, the circuit arrangement per FIG. 5 with a saturating test signal of the appropriate polarity applied to the amplifier 12 causes the LED 42 to be on so long as the voltage of the battery 10 is at an acceptable level.

Figure 6:
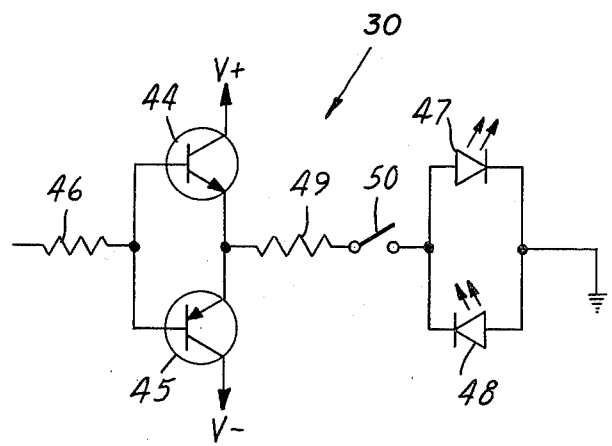
FIG. 6 is a schematic of an indicating means usable in the embodiment of FIG. 3.

Referring to FIG. 3, the indicating means 30 may be provided by the circuit shown in FIG. 6. As in FIG. 4, an NPN transistor 44 and a PNP transistor 45 provide a drive circuit that is coupled to the output 6 of the operational amplifier of FIG. 3 via a resistor 46. It differs from FIG. 4 in that the low battery indication is not provided by a meter, but is provided by the LEDs 47 and 48, one for each battery, which are coupled to the emitters of transistors 44 and 45 via a resistor 49. In the event the batteries 10 and 28 normally present a voltage that is too low for operation of an LED, the cathode of LED 47 is connected to V— of battery 28, while the anode of LED 48 is connected to V+ of battery 10 so that the LEDs will normally have sufficient voltage applied. If desired, a switch 50 can be used to complete the circuit to the LEDs so a battery check is made only when desired. A switch, similar to switch 50, can also be used in the circuit of FIG. 5 to permit selective checking of the battery 10. With the proper selection made for resistor 49, the circuit arrangement of FIG. 6 with a negative saturating test signal applied to the amplifier 12 will cause the LED 47 to be turned on so long as the voltage of the battery 10 is at an acceptable level. Similarly, a positive saturating test signal applied to the amplifier 12 will cause the LED 48 to be turned on so long as the battery 28 is at an acceptable level.

What is claimed is:

1. Apparatus for determining whether a battery is in a replacement condition including an operational amplifier powered from the battery and indicating means operatively connected to the output of the operational amplifier, said operational amplifer having an input for signals obtained independent of the battery, said operational amplifier requiring a signal of one polarity at said input for operation of said indicating means, said indicating means providing a perceptible response when an input signal of said one polarity is applied to said input, said perceptible response including a replace battery indication which is provided when the voltage of the battery is less than a predetermined level and a saturation signal of said one polarity and independent of the battery is then applied to said input of said operational amplifier.

2. The apparatus of claim 1 wherein said indicating means includes a meter movement and a meter face, said meter face having a reference position relative to and within the movement of said meter movement for signals of said one polarity for providing said replace battery indication.

3. The apparatus of claim 1 wherein said indicating means includes a light source which presents said replace battery condition, said light source energized in response to operation of said operational amplifier at saturation only so long as the battery is not in a replacement condition.

4. The apparatus of claim 3 wherein said indicating means includes a switch means for operatively connecting said light source to the output of said operational amplifier.

5. The apparatus of claim 3 wherein said light source is a light emitting diode.

6. An improved heat scanner circuit including an operational amplifier having an input and for operation requiring a voltage supply of one polarity available from a first battery and voltage supply of the opposite polarity from a second battery; a signal means operatively connected to the input of the operational amplifier and capable of providing either a positive or negative signal to the operational amplifier to cause the amplifier to operate at saturation; an indicating means operatively connected to the output of the amplifier, the indicating means including a meter movement and meter face, the improvement including two replace battery reference positions provided at said meter face, one of said reference positions established relative to the position the meter movement assumes when the first battery presents a predetermined unacceptable voltage while a saturating signal of one polarity that is independent of the first and second batteries is applied to said input of said operational amplifier, said one reference position being reached by less movement of the meter in the same direction than that which is obtained in response to a saturating signal of said one polarity applied when said first battery presents a voltage that is greater than the acceptable voltage for said first battery, and said other of said reference positions established relative to the position the meter movement assumes when the second battery presents said predetermined unacceptable voltage while a saturating signal of the opposite polarity that is independent of the first and second batteries is applied to said input of said operational amplifier, said other reference position being reached by less movement of the meter in the same direction than that which is obtained in response to a saturating signal of said opposite polarity applied when said second battery presents a voltage that is greater than the predetermined unacceptable voltage for said second battery.

* * * * *